United States Patent
Yoshioka et al.

(10) Patent No.: US 12,040,756 B2
(45) Date of Patent: Jul. 16, 2024

(54) POWER AMPLIFIER

(71) Applicant: Mitsubishi Electric Corporation, Tokyo (JP)

(72) Inventors: Takaaki Yoshioka, Tokyo (JP); Kenji Harauchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 472 days.

(21) Appl. No.: 17/312,613

(22) PCT Filed: Apr. 4, 2019

(86) PCT No.: PCT/JP2019/014973
§ 371 (c)(1),
(2) Date: Jun. 10, 2021

(87) PCT Pub. No.: WO2020/202532
PCT Pub. Date: Oct. 8, 2020

(65) Prior Publication Data
US 2022/0045654 A1    Feb. 10, 2022

(51) Int. Cl.
*H03F 3/68* (2006.01)
*H03F 3/21* (2006.01)
*H03F 3/60* (2006.01)

(52) U.S. Cl.
CPC ............. *H03F 3/21* (2013.01); *H03F 3/211* (2013.01); *H03F 3/602* (2013.01); *H03F 2200/451* (2013.01)

(58) Field of Classification Search
CPC .... H03F 3/21; H03F 2200/451; H03F 1/3205; H03F 3/604; H03F 3/68; H03F 3/211;
(Continued)

(56) References Cited

U.S. PATENT DOCUMENTS 5,111,157 A * 5/1992 Komiak ............... H03F 3/604
330/307
8,698,564 B2 * 4/2014 Kamiyama ........... H03F 3/211
330/124 R
(Continued)

FOREIGN PATENT DOCUMENTS

| JP | H11-150431 A | 6/1999 |
| JP | 2002-171138 A | 6/2002 |
| JP | 2013-065960 A | 4/2013 |

OTHER PUBLICATIONS

International Search Report; Written Opinion; and Notification of Transmittal of the International Search Report and the Written Opinion of the International Searching Authority, or the Declaration issued in PCT/JP2019/014973; mailed Jun. 25, 2019.

*Primary Examiner* — Khanh V Nguyen
(74) *Attorney, Agent, or Firm* — Studebaker & Brackett PC

(57) ABSTRACT

A power amplifier includes: plural amplifiers; a tournament-tree-shaped circuit connected with the plural amplifiers and including plural transmission lines arranged in a tournament-tree shape; and plural difference frequency short circuits shunt-connected with plural nodes of the tournament-tree-shaped circuit, wherein each of the plural difference frequency short circuits includes an inductor and a capacitor connected in series, resonant frequencies of the plural difference frequency short circuits become lower as the plural difference frequency short circuits are more separated from the plural amplifiers, and the difference frequency short circuits having equivalent resonant frequencies are connected with plural nodes in the same stage among the plural nodes.

14 Claims, 14 Drawing Sheets

(58) Field of Classification Search
CPC ........ H03F 3/602; H03F 3/195; H03F 1/0288;
H03F 3/607; H03F 3/60
USPC ..................................... 330/124 R, 286, 295
See application file for complete search history.

(56) References Cited

U.S. PATENT DOCUMENTS

2002/0067212 A1   6/2002   Takenaka
2013/0069726 A1   3/2013   Mochizuki

* cited by examiner

POWER AMPLIFIER

FIELD

The present disclosure relates to a power amplifier.

BACKGROUND

With enlargement of an information transmission amount in wireless communication, a microwave power amplifier has been strongly demanded which has proper distortion characteristics when a bandwidth of a high-frequency signal carrying information is expanded. A frequency interval between a high frequency edge and a low frequency edge of a bandwidth of a high-frequency signal is referred to as detuning range or detuning frequency, and the frequency corresponding to the range is referred to as difference-frequency wave frequency or simply as difference frequency. In order to realize proper distortion characteristics, it is effective to lower an impedance at a difference frequency by viewing a matching circuit from a transistor end. A procedure has been known in which plural resonance circuits having different resonant frequencies are connected with a matching circuit.

For example, PTL 1 discloses a method in which another end of a $\lambda/4$ line whose one end is connected with a drain end of a transistor or an output end of an amplifier is connected with a capacitor in which series resonance occurs at inductance of a line and a difference frequency and degradation of distortion characteristics is thereby prevented in a microwave power amplifier.

CITATION LIST

Patent Literature

[PTL 1] JP H11-150431 A

In the technique disclosed in PTL 1, a bias circuit impedance at a detuning frequency or lower is set to a sufficiently low value, the bias circuit impedance at an operation frequency of the amplifier is set to an almost open-circuit impedance, and loss in an operation frequency band due to a bias circuit can be decreased while degradation of the distortion characteristics is prevented. However, the above technique has a problem that when the detuning frequency becomes high to the order of 100 MHz, the impedance at the difference frequency cannot be set to a low value in a broadband from the order of 1 MHz to the order of 100 MHz, and degradation of distortion cannot be prevented with respect to all desired detuning frequencies.

Meanwhile, it is possible that plural difference frequency short circuits having plural different resonant frequencies are directly connected with drain terminals. In this case, there has been a problem that due to restriction of a mounting area in a package, unless a package size is made large, not all of inductors and capacitors constituting the difference frequency short circuits can be arranged. In order to obtain basic characteristics such as high efficiency and output in a microwave power amplifier, with respect to all transistors, it is necessary to uniformize operations of all the transistors by equalizing impedances in a case of viewing respective matching circuits, with which the transistors are connected, from the transistors.

On the other hand, there has been a problem that in a case where equivalent difference frequency short circuits are individually arranged for all of unit transistors, layout design is restricted, the basic characteristics are lowered due to an increase in circuit loss, and size reduction of a product is hindered.

The present invention has been made to solve the above-described problems, and an object is to provide a power amplifier, in a power amplifier amplifying a microwave at several GHz or higher, for example, the power amplifier reducing an impedance of a connection circuit as seen from an end of a unit transistor at a difference frequency with respect to each of all plural arranged transistors and preventing degradation of distortion characteristics from a minimum detuning frequency to a maximum detuning frequency without decreasing a degree of freedom of layout design or causing enlargement of a package size.

Solution to Problem

A power amplifier according to the present disclosure includes: plural amplifiers; a tournament-tree-shaped circuit connected with the plural amplifiers and including plural transmission lines arranged in a tournament-tree shape; and plural difference frequency short circuits shunt-connected with plural nodes of the tournament-tree-shaped circuit, wherein each of the plural difference frequency short circuits includes an inductor and a capacitor connected in series, resonant frequencies of the plural difference frequency short circuits become lower as the plural difference frequency short circuits are more separated from the plural amplifiers, and the difference frequency short circuits having equivalent resonant frequencies are connected with plural nodes in the same stage among the plural nodes.

Other features of the present disclosure will be clarified below.

Advantageous Effects of Invention

In the present disclosure, resonant frequencies of the plural difference frequency short circuits connected with the tournament-tree-shaped circuit become lower as the plural difference frequency short circuits are more separated from the plural amplifiers. The difference frequency short circuits having equivalent resonant frequencies are connected with plural nodes in the same stage among the plural nodes of the tournament-tree-shaped circuit. Therefore, it is possible to provide a power amplifier that contributes to increasing the capacity of information transmission by suppressing distortion and amplifying a high-frequency signal regardless of its detuning frequency.

DESCRIPTION OF EMBODIMENTS

A power amplifier according to the embodiments of the present disclosure will be described with reference to the drawings. The same components will be denoted by the same symbols, and the repeated description thereof may be omitted.

First Embodiment

Figure 1:
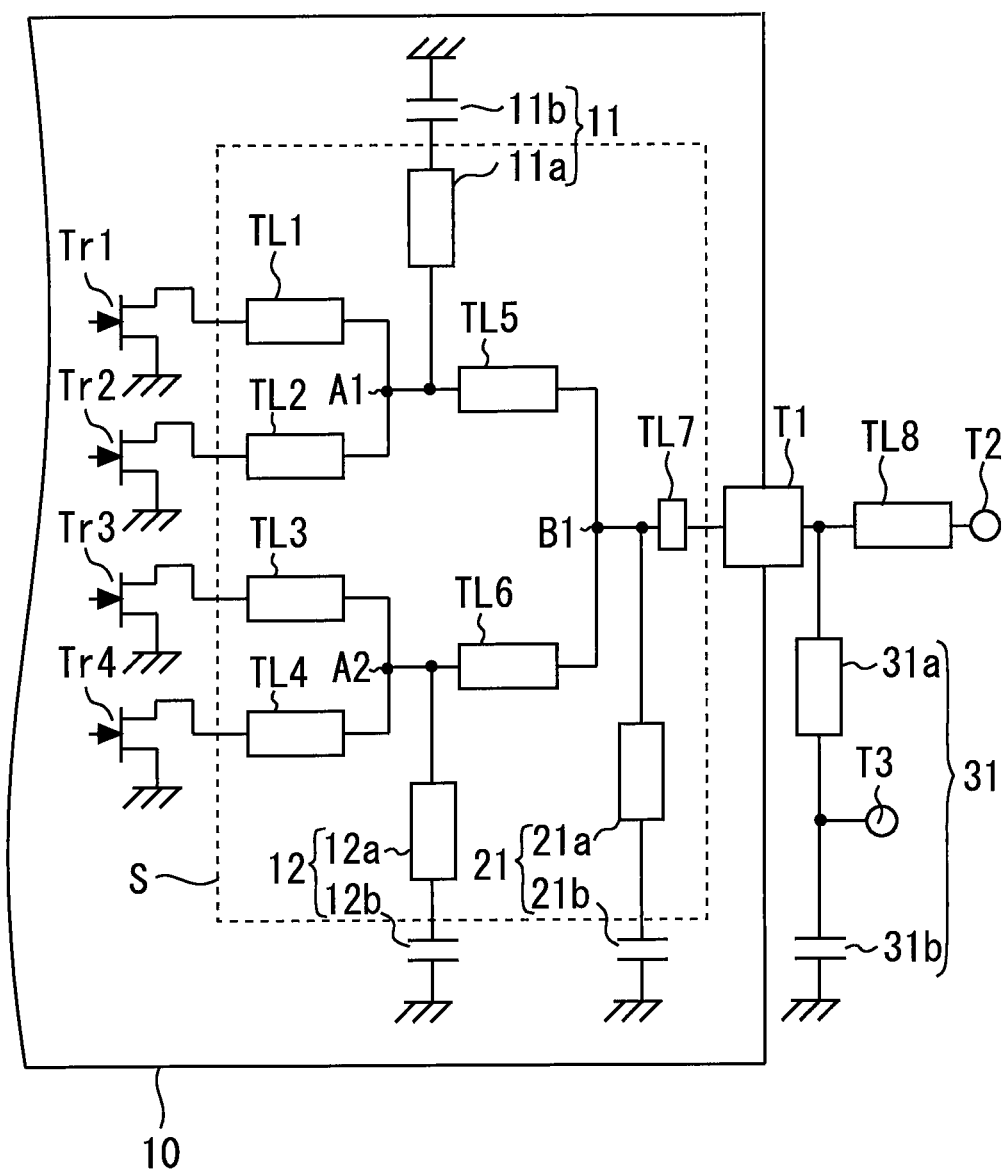
FIG. 1 is a circuit diagram illustrating a power amplifier according to a first embodiment.

FIG. 1 is a circuit diagram illustrating a power amplifier according to a first embodiment. This power amplifier can be provided as a microwave power amplifier. This power amplifier includes transistors Tr1, Tr2, Tr3, and Tr4 as plural amplifiers. The transistor Tr1 is a unit transistor in which a transistor cell is connected in parallel. Similarly, the transistors Tr2, Tr3, and Tr4 may be formed as unit transistors in which a transistor cell is connected in parallel. In another example, as the plural amplifiers, plural transistor cells may be provided.

One ends of transmission lines TL1, TL2, TL3, and TL4 are respectively connected with drain ends of the transistors Tr1, Tr2, Tr3, and Tr4. The other end of the transmission line TL1 and the other end of the transmission line TL2 are connected together at a combining point A1. The other end of the transmission line TL3 and the other end of the transmission line TL4 are connected together at a combining point A2. One end of a transmission line TL5 and one end of a transmission line TL6 are respectively connected with the combining points A1 and A2. The other end of the transmission line TL5 and the other end of the transmission line TL6 are connected together at a combining point B1. This combining point B1 is connected with a transmission line TL7. The transmission line TL7 is connected with a terminal T2 as an output terminal via a package terminal T1 and a transmission line TL8.

As described above, the transmission lines TL1, TL2, TL3, TL4, TL5, TL6, TL7, and TL8 are arranged in a tournament-tree shape. Those transmission lines constitute a tournament-tree-shaped circuit which is connected with the transistors Tr1, Tr2, Tr3, and Tr4 as the plural amplifiers. The tournament-tree-shaped circuit in the first embodiment is a tournament-tree-shaped combiner circuit which combines amplification signals of the plural amplifiers. The tournament-tree-shaped combiner circuit repeats signal combination in which power from two transistors is first combined together in a first stage and combined power is next further combined in a second stage.

Four difference frequency short circuits 11, 12, 21, and 31 are connected with this tournament-tree-shaped circuit. The difference frequency short circuit 11 includes an inductor 11a as a λ/4 line whose one end is connected with the combining point A1 and a capacitor 11b connected with the other end of the inductor 11a. A λ/4 line denotes a ¼ wavelength line at a fundamental wave frequency of an operation frequency of a power amplifier. Inductance of the inductor 11a is L1. The capacitor 11b has a capacitance C1 which causes series resonance with the inductor 11a at a difference frequency Δf1.

The difference frequency short circuit 12 includes an inductor 12a as a λ/4 line whose one end is connected with the combining point A2 and a capacitor 12b connected with the other end of the inductor 12a. The inductance of the inductor 12a is L1. The capacitor 12b has the capacitance C1 which causes series resonance with the inductor 12a at the difference frequency Δf1.

The difference frequency short circuit 21 includes an inductor 21a as a λ/4 line whose one end is connected with the combining point B1 and a capacitor 21b connected with the other end of the inductor 21a. The inductance of the inductor 21a is L1. The capacitor 21b has a capacitance C2 which causes series resonance with the inductor 21a at a difference frequency Δf2.

The difference frequency short circuit 31 includes an inductor 31a as a λ/4 line whose one end is connected with the combining point B1 via the transmission line TL7 and a capacitor 31b connected with the other end of the inductor 31a. The inductance of the inductor 31a is L1. The capacitor 31b has a capacitance C3 which causes series resonance with the inductor 31a at a difference frequency Δf3. A terminal T3 as a Vd terminal applying a drain voltage to the transistors Tr1, Tr2, Tr3, and Tr4 is connected between the inductor 31a and the capacitor 31b.

The four difference frequency short circuits 11, 12, 21, and 31 are shunt-connected with plural nodes of the tournament-tree-shaped circuit. With respect to each of the difference frequency short circuits, an electrical length between a connection point between the difference frequency short circuit and the tournament-tree-shaped circuit and the plural transistors supplying power to the connection point is equivalent. In this case, the following relationships are present among the inductors, the capacitors, and resonant frequencies.

$L1 \times C1 = 1/(2\pi \Delta f1)^2$ $L1 \times C2 = 1/(2\pi \Delta f2)^2$ $L1 \times C3 = 1/(2\pi \Delta f3)^2$ The resonant frequencies Δf1, Δf2, and Δf3 of the plural difference frequency short circuits are present between a minimum value and a maximum value which can be given as the differential frequency (or difference frequency) between a high frequency edge and a low frequency edge of a high-frequency signal to be amplified by the plural amplifiers. Because a setting of a bandwidth is different among communication systems, those minimum value and maximum value fluctuate depending on the communication system. Further, the magnitude relationship among Δf1, Δf2, and Δf3 is as follows.

$\Delta f3 < \Delta f2 < \Delta f1$

That is, the relationship of C1<C2<C3 is present among C1, C2, and C3. Consequently, the resonant frequencies of the plural difference frequency short circuits 11, 12, 21, and 31 become lower as those are more separated from the plural transistors Tr1 Tr2, Tr3, and Tr4. With respect to the λ/4 lines constituting all of the difference frequency short circuits, the inductance L1 of the λ/4 line is the same value.

Transmission lines connected between unit transistor ends and the package terminal T1 and the inductors as the λ/4 lines in the same region can be formed by patterning those with metal on a microwave integrated circuit (MIC) substrate S. Furthermore, the substrate S, the transistors Tr1, Tr2, Tr3, and Tr4, and the capacitors 11$b$, 12$b$, and 21$b$ are mounted on the package 10 by using solder or the like.

In general, the distortion characteristics of a high-frequency signal expanded with a bandwidth are evaluated by inputting two sinusoidal signals, whose frequencies are respective single frequencies at the low frequency edge and the high frequency edge of the high-frequency signal and whose signal intensities are equivalent, to the amplifier and by using produced third-order intermodulation distortion IM3 as an index. An interval between a high frequency edge and a low frequency edge of a high-frequency signal with a bandwidth, that is, an interval between two single frequency signals in IM3 evaluation is referred to as detuning range or detuning frequency, and the frequency corresponding to the range is referred to as difference-frequency wave frequency or simply as difference frequency. Note that for example, a detuning frequency of a high-frequency signal used in a transmission system of satellite communication has been a maximum of approximately 5 MHz. However, in recent years, there is a demand for extension to the order of 100 MHz, a maximum of approximately 200 MHz.

In order to facilitate understanding of significance of the power amplifier according to the first embodiment, four configurations of microwave power amplifiers in first, second, and third comparative examples and the first embodiment will be analyzed. The first comparative example is a known microwave power amplifier, the second comparative example is a known microwave power amplifier in which three difference frequency short circuits are arranged outside a package, and the third comparative example is a known microwave power amplifier in which difference frequency short circuits are arranged at drain ends of unit transistors close to package side walls. Each of the configurations will in order be described by using a circuit diagram and an example of an impedance at a difference frequency (hereinafter referred to as difference frequency impedance) in a case where in a circuit, an output circuit is seen from a drain end of a transistor and an example of a simulation result of the IM3.

First Comparative Example

Figure 2:
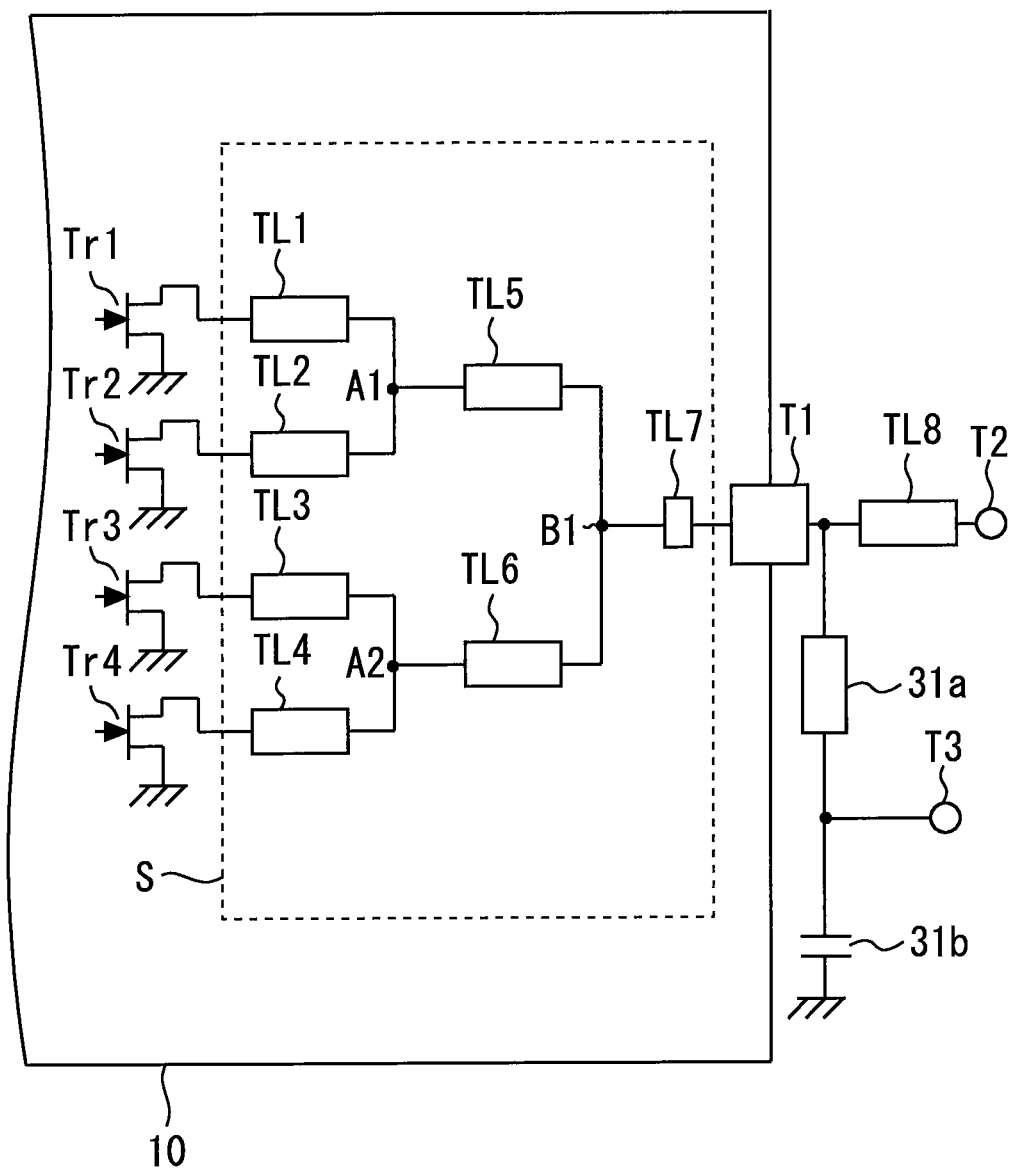
FIG. 2 is a circuit diagram of the microwave power amplifier of the first comparative example.

First, as for a known microwave power amplifier, a circuit configuration, the difference frequency impedance of an output circuit thereof, and the IM3 will be discussed. FIG. 2 is a circuit diagram of the microwave power amplifier of the first comparative example. This microwave power amplifier includes transistors Tr1, Tr2, Tr3, and Tr4 and a tournament-tree-shaped combiner circuit which combines their outputs at combining points A1, A2, and B1. The difference frequency short circuit having an inductor 31$a$ and a capacitor 31$b$ is connected with a package terminal T1 connected with a transmission line TL7. The inductor 31$a$ is a λ/4 line. The capacitor 31$b$ has a capacitance C3 which causes series resonance with the inductor 31$a$ at a difference frequency Δf.

In this case, the following relationship is present among the inductor 31$a$, the capacitor 31$b$, and a resonant frequency.

$$L1 \times C3 = 1/(2\pi\Delta f)^2$$

Figure 3:
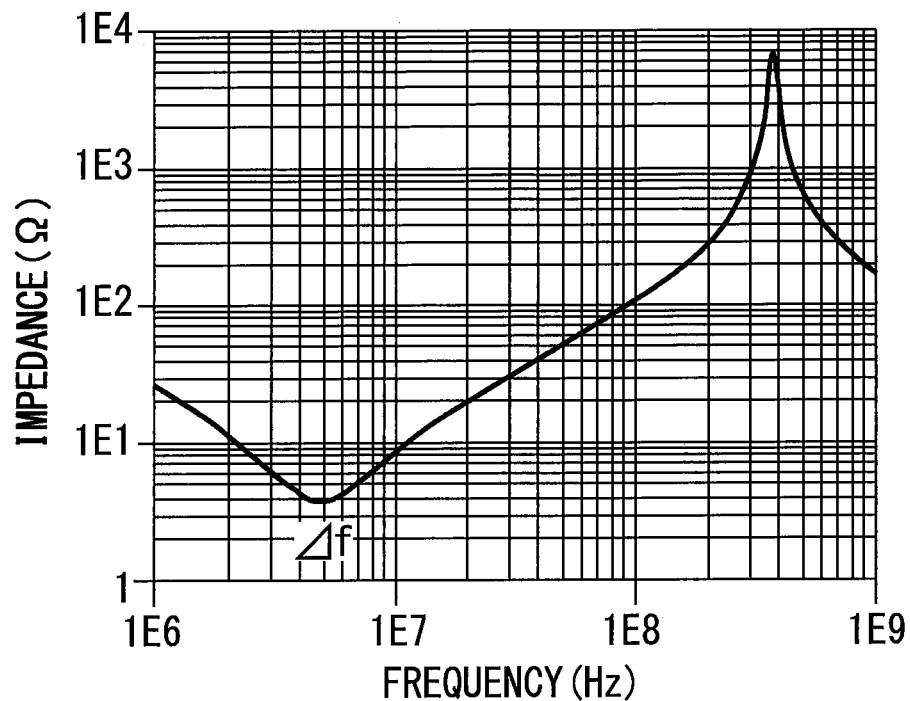
FIG. 3 is a diagram illustrating the example of the difference frequency impedance of the output circuit of the first comparative example.

FIG. 3 is a diagram illustrating the example of the difference frequency impedance of the output circuit in the microwave power amplifier of the first comparative example. FIG. 3 illustrates the impedance in a case of viewing the output circuit side from the drain end of the transistor from 1 MHz to 1 GHz with both axes in logarithmic scales. In the example of this circuit configuration, a resonance point is formed at 5 MHz by appropriately setting L1 and C3, and the impedance at the vicinity of 5 MHz is thereby reduced to 10Ω or lower. On the other hand, the impedance in the order of 100 MHz which is separated from the resonant frequency is a large value of 100Ω or higher. For example, the impedance at 200 MHz is 250Ω.

Figure 4:
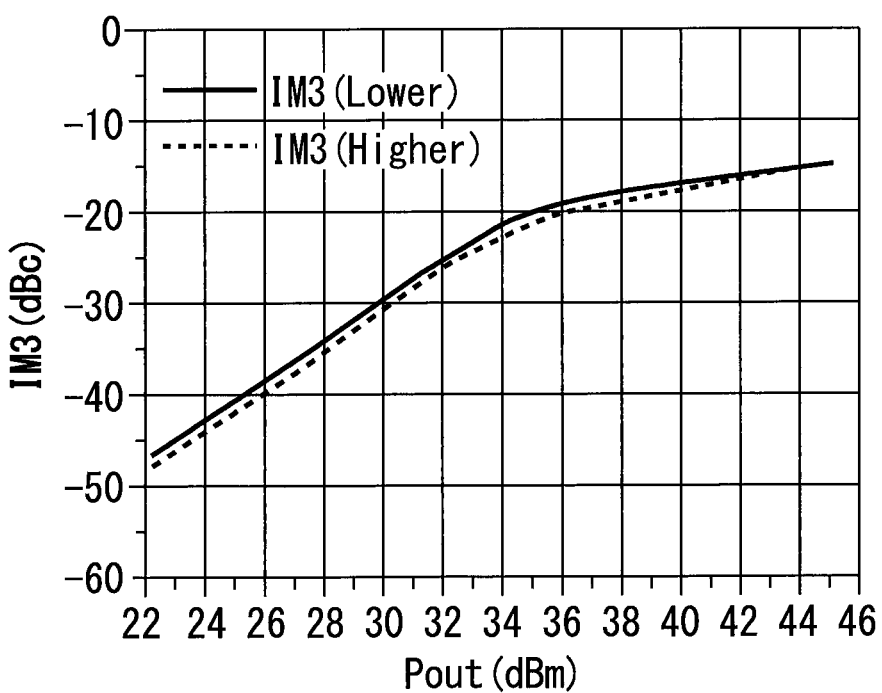
FIG. 4 is a diagram illustrating the example of the simulation result of the IM3 of the first comparative example.

FIG. 4 is a diagram illustrating the example of the simulation result of the IM3 in the microwave power amplifier of the first comparative example, which is illustrated in FIG. 2. This simulation example is obtained by calculating the relationship between output power and the IM3 of a microwave amplifier in a case where input signals of two waves whose detuning frequency is 200 MHz are input to the transistor. In FIG. 4, between two pieces of IM3 appearing in the vicinities of the input signals, a distortion component appearing on a low frequency side of the input signals is indicated by a solid line, and a distortion component appearing on a high frequency side is indicated by a dotted line. It may be understood from FIG. 4 that the greater value between two distortion components as worst values of the IM3 at output power of 44 dBm, for example, is −15 dBc.

Second Comparative Example

Figure 5:
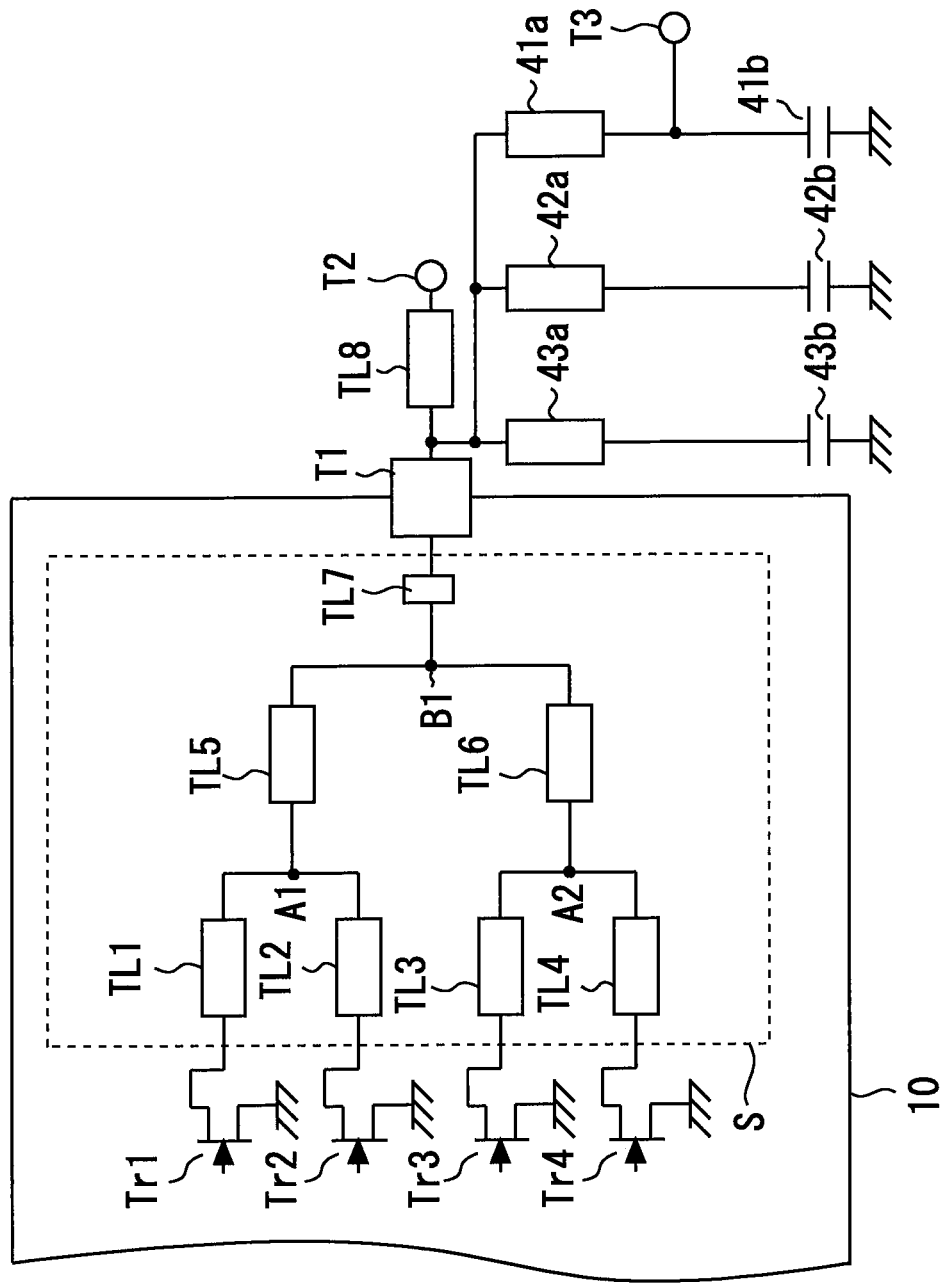
FIG. 5 is a circuit diagram of the microwave power amplifier of the second comparative example.

Next, a circuit configuration in a case where in a known microwave power amplifier, three difference frequency short circuits are arranged outside a package 10, the difference frequency impedance of an output circuit thereof, and the IM3 will be discussed. FIG. 5 is a circuit diagram of the microwave power amplifier of the second comparative example. Three difference frequency short circuits are arranged outside the package 10. Specifically, an inductor 41$a$ connected with a package terminal T1 and a capacitor 41$b$ form a first difference frequency short circuit, an inductor 42$a$ connected with the package terminal T1 and a capacitor 42$b$ form a second difference frequency short circuit, and an inductor 43$a$ connected with the package terminal T1 and a capacitor 43$b$ form a third difference frequency short circuit. The inductors 41$a$, 42$a$, and 43$a$ may be λ/4 lines. The capacitors 41$b$, 42$b$, and 43$b$ respectively have capacitances C1, C2, and C3 which cause series resonance with the inductors 41$a$, 42$a$, and 43$a$ at difference frequencies Δf1, Δf2, and Δf3. A configuration in the package 10 is the same as the circuit configuration illustrated in FIG. 2.

In this case, the following relationships are present among the inductors, the capacitors, and resonant frequencies.

$$L1 \times C1 = 1/(2\pi\Delta f1)^2$$

$$L1 \times C2 = 1/(2\pi\Delta f2)^2$$

$$L1 \times C3 = 1/(2\pi\Delta f3)^2$$

Figure 6:
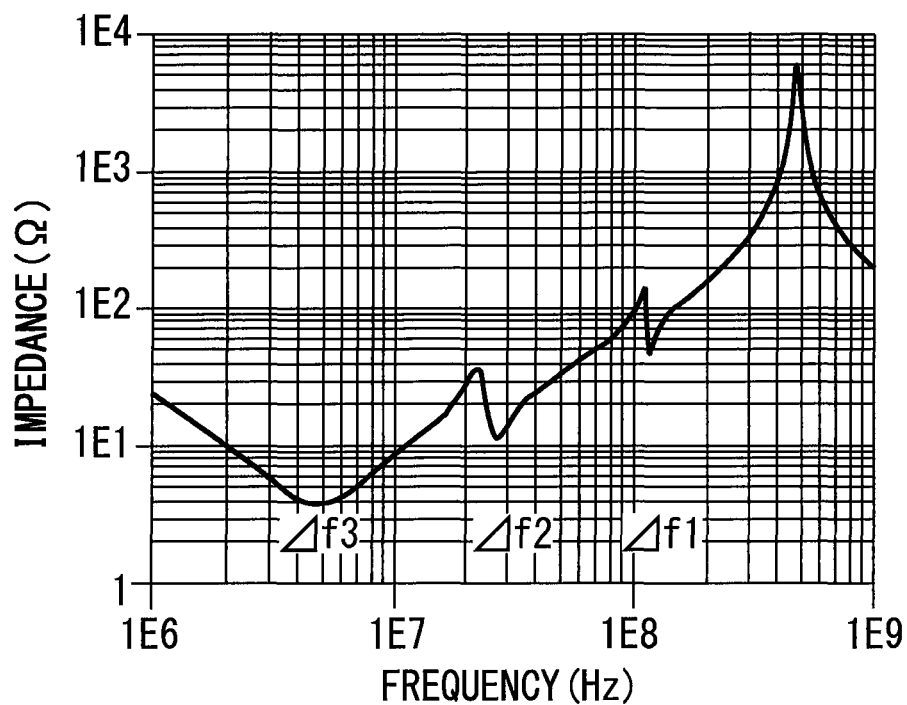
FIG. 6 is a diagram illustrating the example of the difference frequency impedance of the output circuit of the second comparative example.

FIG. 6 is a diagram illustrating the example of the difference frequency impedance of the output circuit in the microwave power amplifier of the second comparative example. Similarly to FIG. 3, FIG. 6 illustrates the impedance in a case of viewing the output circuit side from a transistor end from 1 MHz to 1 GHz with both axes in logarithmic scales. In the example of this circuit configuration, resonance points are formed at three parts of 5 MHz, 30 MHz, and 100 MHz by appropriately setting L1, C1, C2, and C3, and the impedances at the vicinities of 5 MHz, 30 MHz, and 100 MHz are thereby reduced compared to impedances at peripheral frequencies. As a result, it may be understood that the impedance at 200 MHz is 150Ω and is reduced compared to the impedance illustrated in FIG. 3. As described above, the impedance in the order of 100 MHz is reduced at the vicinity of the resonant frequency compared to values at its peripheral frequencies; however, the absolute value of the impedance cannot be reduced as much as values in the order of 1 MHz. This is because the transmission line is present between a transistor end and a connection point of the difference frequency short circuit, a reflection phase occurring in the transmission line thus cannot be ignored at frequencies in the order of 100 MHz, and an ideal short-circuit point cannot be formed. On the other hand, because at frequencies in the order of 1 MHz, the electrical length between the transistor end and the connection point of the difference frequency short circuit appears to be short to the extent that the electrical length can be ignored, an almost ideal short-circuit point can be formed.

Figure 7:
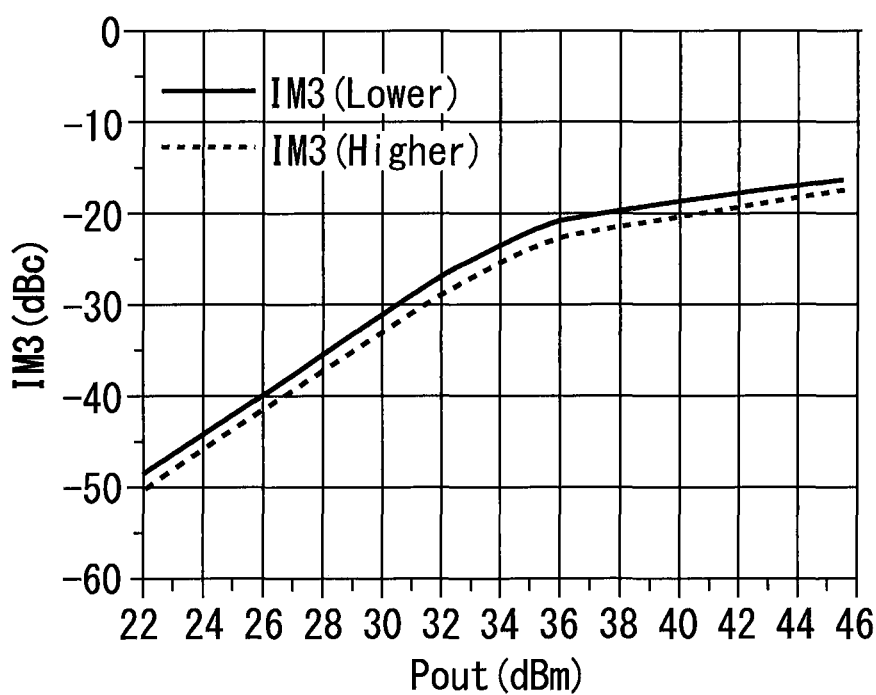
FIG. 7 is a diagram illustrating the example of the simulation result of the IM3 of the second comparative example.

FIG. 7 is a diagram illustrating the example of the simulation result of the IM3 in the microwave power amplifier of the second comparative example, which is illustrated in FIG. 5. Similarly to FIG. 4, this simulation example is obtained by calculating the relationship between output power and the IM3 of a microwave amplifier in a case where input signals of two waves whose detuning frequency is 200 MHz are input to the transistor. In FIG. 7, it may be understood that the worst value of the IM3 at output power of 44 dBm is −17 dBc. Consequently, the result in FIG. 7 can be considered to be improved by 2 dB compared to the worst value of the IM3 illustrated in FIG. 4; however, because reduction in the difference frequency impedance is not sufficient, an improvement amount cannot be considered to be sufficient.

Third Comparative Example

Next, to solve the above problems, a case will be discussed where the difference frequency short circuit is directly connected with a drain terminal of a transistor such that the transmission line between the transistor end and the connection point of the difference frequency short circuit becomes as short as possible. However, because no space is present which is for arranging a capacitor between a transistor chip in which transistors are arranged and a substrate S on which transmission lines are formed by patterning and further for grounding the capacitor, it is impossible to connect the difference frequency short circuits with drain terminals of all unit transistors. Even if a sufficient space can be secured, when the difference frequency short circuits are connected with the drain terminals of all the unit transistors, a circuit area and a package size are enlarged, and costs for manufactured members increase. Thus, the difference frequency short circuits are connected only with drain ends of transistors Tr1 and Tr4 close to side wall portions of a package 10. Thus, here, as the third comparative example, a circuit configuration in a case where in a known microwave power amplifier, the difference frequency short circuits are arranged at the drain ends of the transistors Tr1 and Tr4 close to side walls of the package 10 and the difference frequency impedance of an output circuit thereof will be discussed.

Figure 8:
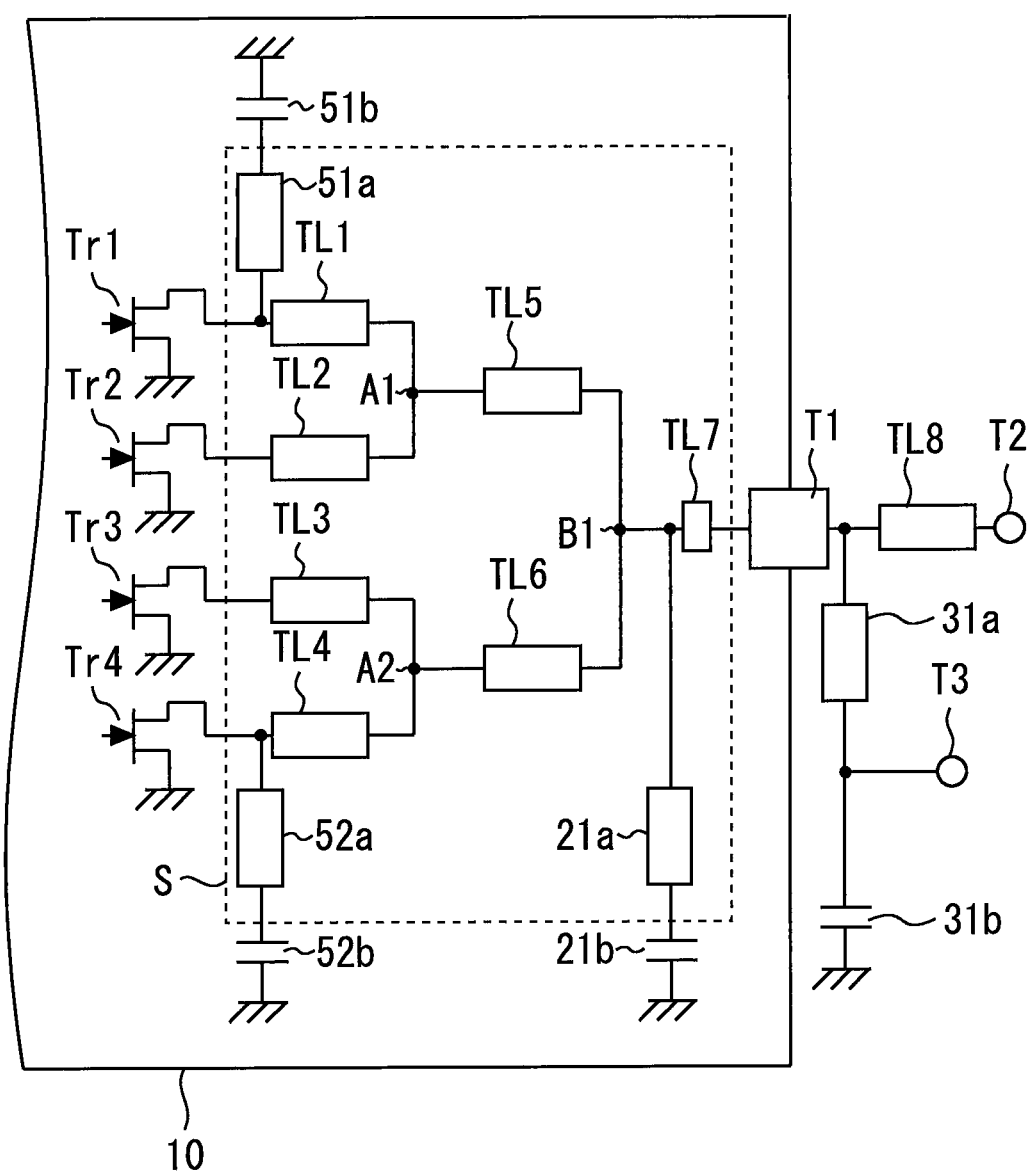
FIG. 8 is a circuit diagram of the microwave power amplifier of the third comparative example.

FIG. 8 is a circuit diagram of the microwave power amplifier of the third comparative example. In the package 10, a difference frequency short circuit having an inductor 51a and a capacitor 51b and a difference frequency short circuit having an inductor 52a and a capacitor 52b are arranged. The difference frequency short circuit having the inductor 51a and the capacitor 51b is connected with the drain end of the transistor Tr1 close to a side wall portion of the package 10. The difference frequency short circuit having the inductor 52a and the capacitor 52b is connected with the drain end of the transistor Tr4 close to a side wall portion of the package 10. Outside the package 10, a difference frequency short circuit is arranged which has an inductor 31a and a capacitor 31b with a capacitance of C3. Note that the circuit configuration is the same as the circuit configuration illustrated in FIG. 2 except the difference frequency short circuits.

Figure 9:
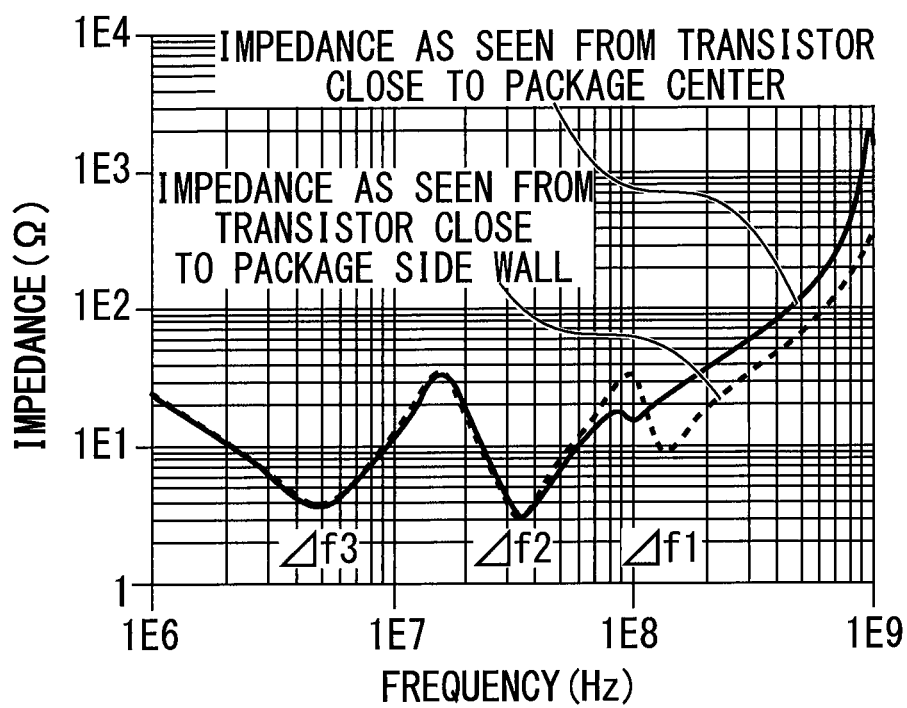
FIG. 9 is a diagram illustrating the example of the difference frequency impedance of the output circuit of the third comparative example.

FIG. 9 is a diagram illustrating the example of the difference frequency impedance of the output circuit in the microwave power amplifier of the third comparative example. Similarly to FIG. 3, FIG. 9 illustrates the impedance in a case of viewing the output circuit side from a transistor end from 1 MHz to 1 GHz with both axes in logarithmic scales. The dotted line indicates the impedance as seen from a unit transistor close to a package side wall, and the solid line indicates the impedance as seen from a unit transistor close to a package center. Similarly to FIG. 6, resonance points are formed at three parts of 5 MHz, 30 MHz, and 100 MHz, and the impedances at the vicinities of 5 MHz, 30 MHz, and 100 MHz are reduced compared to values at peripheral frequencies. As a result, in a case where the impedance is seen from the unit transistor close to the package side wall, the impedance at 200 MHz is 20Ω and is largely reduced compared to the impedance illustrated in FIG. 3. On the other hand, in a case where the impedance is seen from the unit transistor close to the package center, the impedance at 200 MHz is 40Ω. Further, it may be understood that how the impedance in the order of higher 10 MHz to the order of 100 MHz appears is different depending on the unit transistors. This is because with respect to the unit transistor close to the package center, the reflection phase occurring in the transmission line between the transistor end and the connection point of the difference frequency short circuit cannot be ignored.

Example of First Embodiment

The difference frequency impedance of an output circuit and the IM3 in the first embodiment will be discussed while the first embodiment is compared with the three above-described comparative examples. In the first embodiment, the difference frequency short circuit 31 whose resonant frequency is low to the extent that the reflection phase can be ignored is arranged outside the package 10, and the difference frequency short circuits 11, 12, and 21 having resonant frequencies at which the reflection phases cannot be ignored are arranged on the inside of the package 10. For example, such a resonant frequency that the reflection phase can be ignored is a frequency in the order of 1 MHz, and a resonant frequency at which the reflection phase cannot be ignored is a frequency in the order of 10 to 100 MHz. In one example, a difference frequency short circuit having a resonant frequency which is equivalent to or higher than a predetermined specific resonant frequency can be installed in the package 10, and a difference frequency short circuit having a resonant frequency which is lower than the specific resonant frequency can be provided outside the package 10. Such a specific resonant frequency is 10 MHz, for example.

In the example of FIG. 1, the difference frequency short circuits 11 and 12, which have the highest resonant frequencies, among the plural difference frequency short circuits are arranged in the closest parts to the transistors Tr1, Tr2, Tr3, and Tr4, the difference frequency short circuit 21 having the next highest resonant frequency is arranged in a more distant part from the transistors Tr1, Tr2, Tr3, and Tr4 than the difference frequency short circuits 11 and 12, and the difference frequency short circuit 31 having the lowest resonant frequency is arranged in the most distant part from the transistors Tr1, Tr2, Tr3, and Tr4. Accordingly, the resonant frequencies of the plural difference frequency short circuits 11, 12, 21, and 31 become lower as those are more separated from the plural transistors Tr1 Tr2, Tr3, and Tr4.

The difference frequency short circuit arranged in the closest position to the transistors Tr1, Tr2, Tr3, and Tr4 is arranged in a more distant position than a combining point of two transmission lines connected to two transistors such that with respect to all of the transistors Tr1, Tr2, Tr3, and Tr4, the impedances of the output circuit as seen from the transistors become uniform. A case where the impedances are uniform includes not only a case where the impedances are completely same but also a case where the impedances are substantially equivalent.

As a result, the difference frequency short circuits having equivalent resonant frequencies are connected with plural nodes in the same stage among the plural nodes of the tournament-tree-shaped circuit. Specifically, the difference frequency short circuits 11 and 12 having equivalent resonant frequencies are respectively connected with the combining points A1 and A2 as the plural nodes in the same stage among the plural nodes of the tournament-tree-shaped circuit. In this case, a connection part of the difference frequency short circuit can be positioned as close as possible to the combining point of the transmission lines such that an influence of the reflection phase can be suppressed to the minimum.

Figure 10:
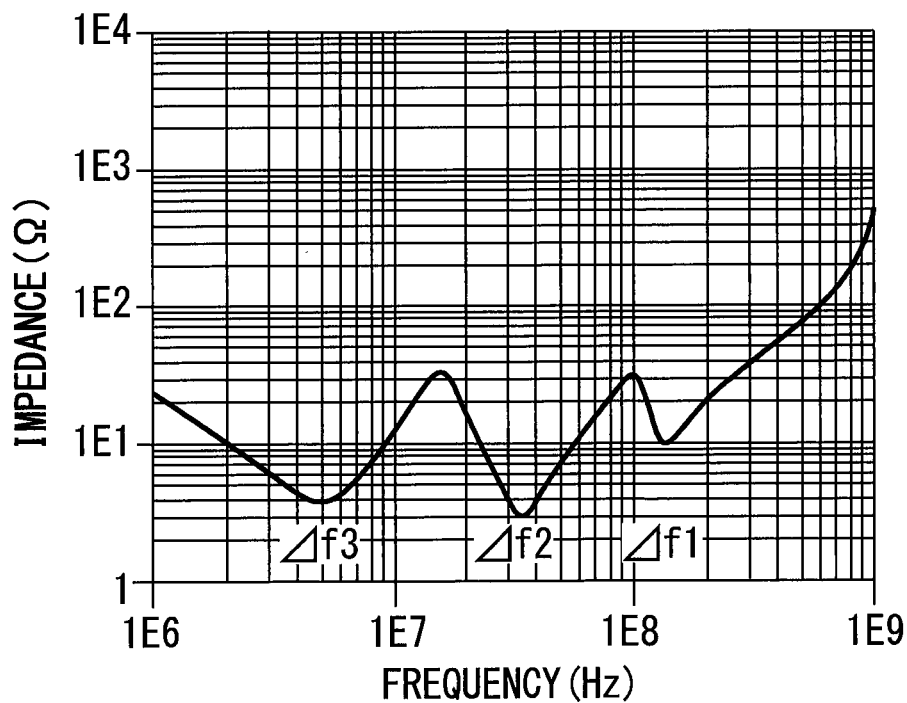
FIG. 10 is a diagram illustrating the example of the difference frequency impedance of the first embodiment.

FIG. 10 is a diagram illustrating the example of the difference frequency impedance of the output circuit in the power amplifier of the first embodiment. Similarly to FIG. 3, FIG. 10 illustrates the impedance in a case of viewing the output circuit side from a transistor end from 1 MHz to 1 GHz with both axes in logarithmic scales. In the example of this circuit configuration, the difference frequency short circuits are connected in the above-described order, and ideal short-circuit points can thereby be formed for all of the arranged difference frequency short circuits. As a result, it may be understood that the impedances in the vicinities of three parts of 5 MHz, 30 MHz, and 100 MHz at which resonance points are formed can be reduced to the generally same extent. Further, in this case, the value of the impedance is equivalent when seen from each of the transistors. As a result, the impedance at 200 MHz is evenly 20Ω regardless of the transistors and is largely reduced compared to the impedance illustrated in FIG. 3.

Figure 11:
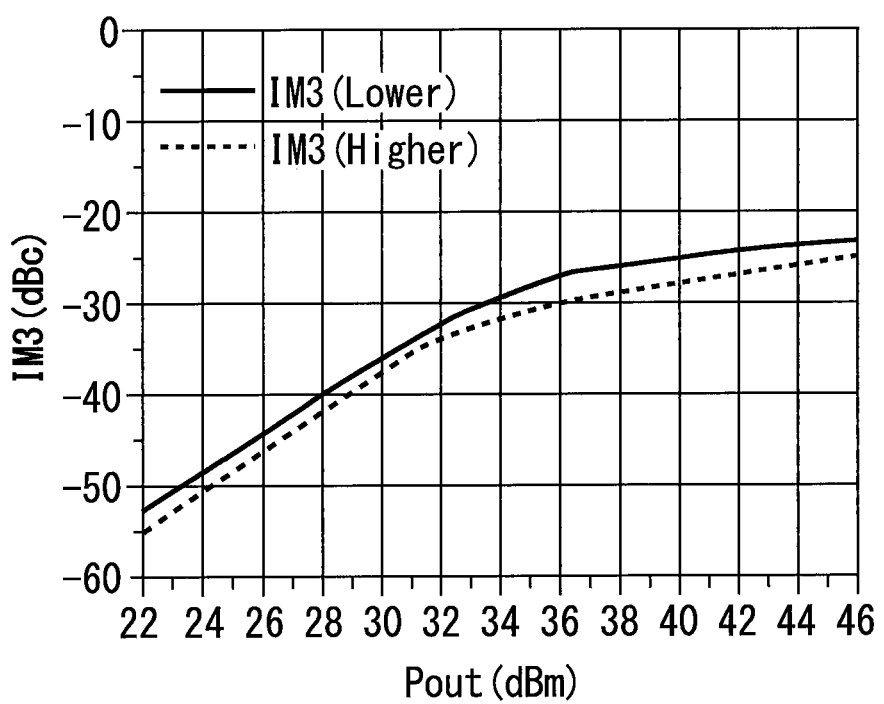
FIG. 11 is a diagram illustrating the example of the simulation result of the IM3 of the first embodiment.

FIG. 11 is a diagram illustrating the example of the simulation result of the IM3 for the configuration of the first embodiment. Similarly to FIG. 4, this simulation example is obtained by calculating the relationship between output power and the IM3 of a microwave amplifier in a case where input signals of two waves whose detuning frequency is 200 MHz are input to the transistor. In FIG. 11, it may be understood that the worst value of the IM3 at output power of 44 dBm is −23 dBc. This value is a value which is improved by approximately 8 dB compared to the worst value of the IM3 illustrated in FIG. 4.

As described above, in the configuration of the first embodiment, because the impedances of the output circuit as seen from transistor connection sides from Δf1 to Δf3 can equivalently be reduced with respect to all of the transistors, a distortion voltage component occurring at the detuning frequency can continuously be suppressed in a frequency band from Δf1 to Δf3. As a result, in a realistic layout of elements which avoids a size increase, it becomes possible to prevent degradation of the distortion characteristics from a minimum detuning frequency to a maximum detuning frequency in a case where a desired detuning frequency is expanded.

The transmission lines connected between transistor ends and the package terminal T1 and the inductors as the λ/4 lines are formed by patterning on the same substrate, and the number of components can thereby be reduced.

Figure 12:
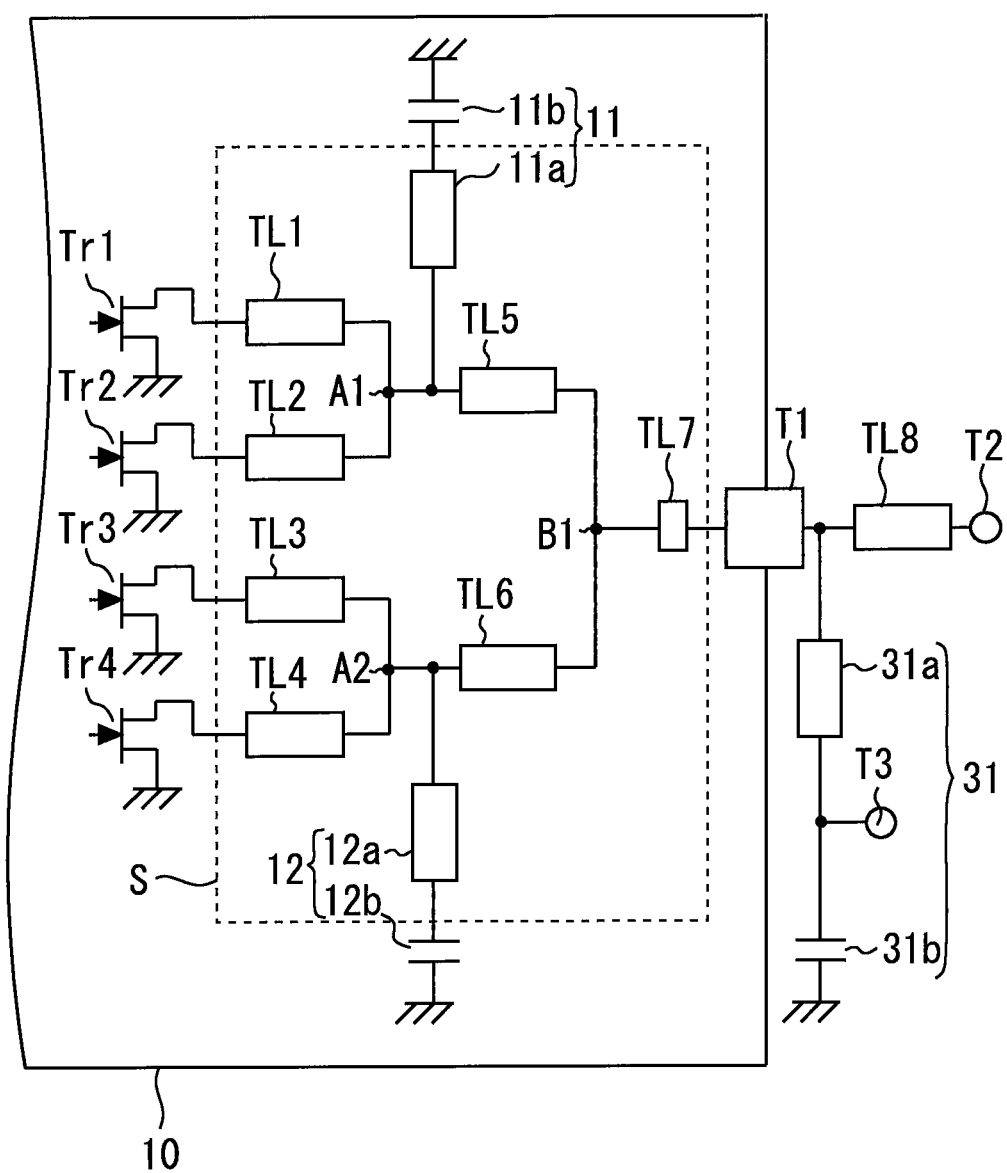
FIG. 12 is a circuit diagram illustrating a power amplifier according to a modification example.

Various modifications of the power amplifier according to the first embodiment may be made within the scope in which characteristics thereof are not lost. For example, in the first embodiment, three difference frequency short circuits are arranged in the package 10; however, the number of difference frequency short circuits may be increased or decreased in consideration of restriction of a component mounting area in the package 10. FIG. 12 is a circuit diagram illustrating a power amplifier according to a modification example. In this case, the difference frequency short circuits 11 and 12 are connected with the combining points A1 and A2 of the transmission lines closest to the transistors, but a difference frequency short circuit is not connected with the combining point B1. Two difference frequency short circuits 11 and 12 are present in the package 10. The capacitance of the capacitor 11b and the capacitor 12b is set to C1.

One difference frequency short circuit 31 is provided outside the package 10. The capacitance of the capacitor 31b is set to C3. In a case where the resonant frequency of the difference frequency short circuits 11 and 12 provided in the package 10 is set to Δf1 and the resonant frequency of the difference frequency short circuit 31 provided outside the package 10 is set to Δf3, setting is made such that Δf3<Δf1, that is, C1<C3 is satisfied.

Connecting the difference frequency short circuit with a certain combining point but not connecting the difference frequency short circuit with another combining point contributes to size reduction of the power amplifier.

Figure 13:
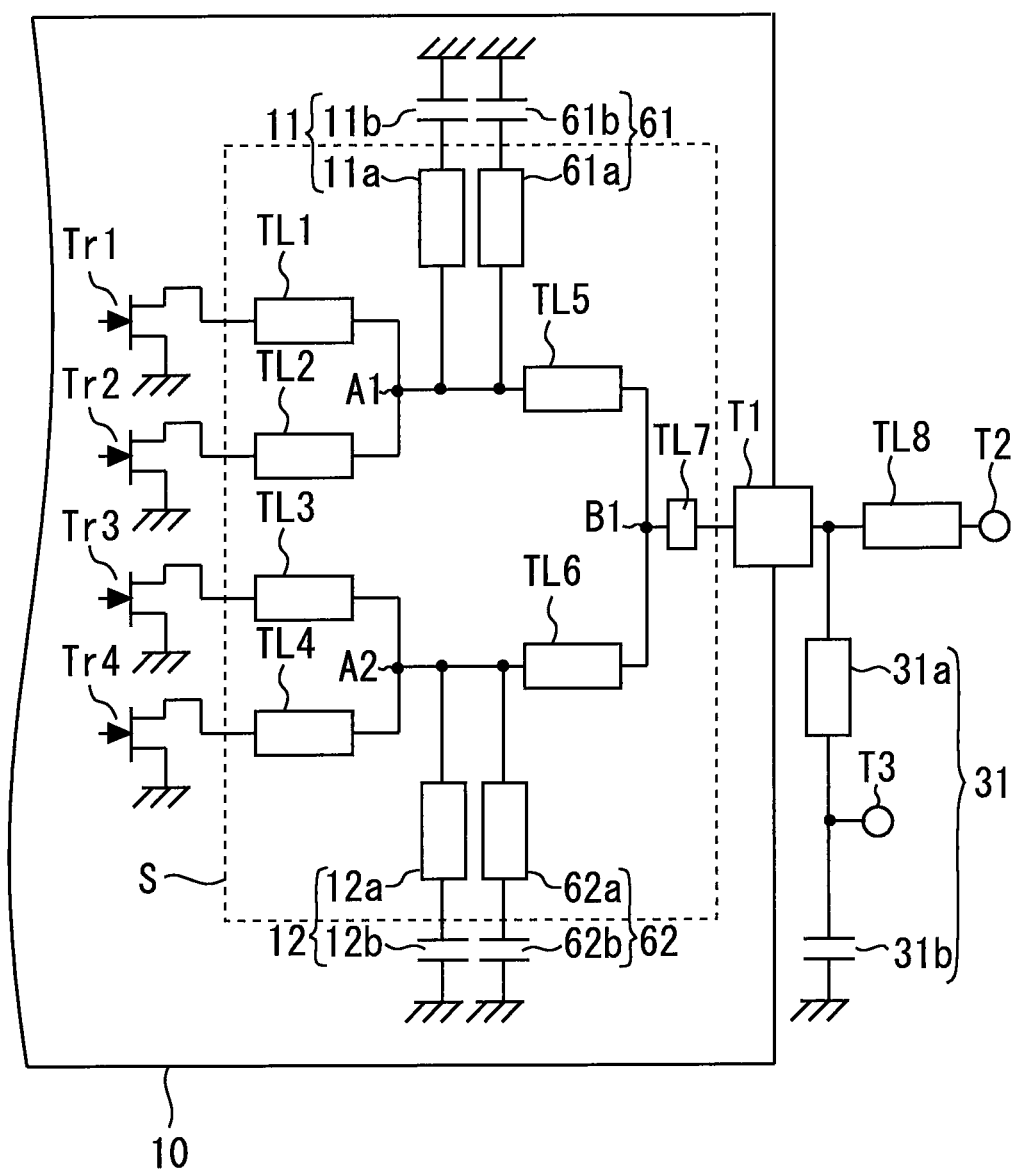
FIG. 13 is a circuit diagram illustrating a power amplifier circuit according to another modification example.

FIG. 13 is a circuit diagram illustrating a power amplifier circuit according to another modification example. This power amplifier circuit includes supplementary difference frequency short circuits 61 and 62. The supplementary difference frequency short circuit 61 is a series LC circuit which is shunt-connected with the combining point A1 as a node with which the difference frequency short circuit 11 is shunt-connected. The supplementary difference frequency short circuit 61 has an inductor 61a and a capacitor 61b. The supplementary difference frequency short circuit 62 is a series LC circuit which is shunt-connected with the combining point A2 as a node with which the difference frequency short circuit 12 is shunt-connected. The supplementary difference frequency short circuit 62 has an inductor 62a and a capacitor 62b.

As described above, plural difference frequency short circuits can be connected with one combining point. In a configuration of FIG. 13, the resonant frequencies of the plural difference frequency short circuits 11, 61, 12, 62, and 31 become lower as those are more separated from the plural transistors Tr1 Tr2, Tr3, and Tr4. However, the resonant frequencies of the difference frequency short circuit 11 and the supplementary difference frequency short circuit 61, which are connected with the same combining point, may be matched or different. The resonant frequencies of the difference frequency short circuit 12 and the supplementary difference frequency short circuit 62, which are connected with the same combining point, may be matched or different. The resonant frequencies of the supplementary difference frequency short circuits 61 and 62 are higher than the resonant frequency of the difference frequency short circuit 31 which is more separated from the plural transistors than the supplementary difference frequency short circuits 61 and 62.

Figure 14:
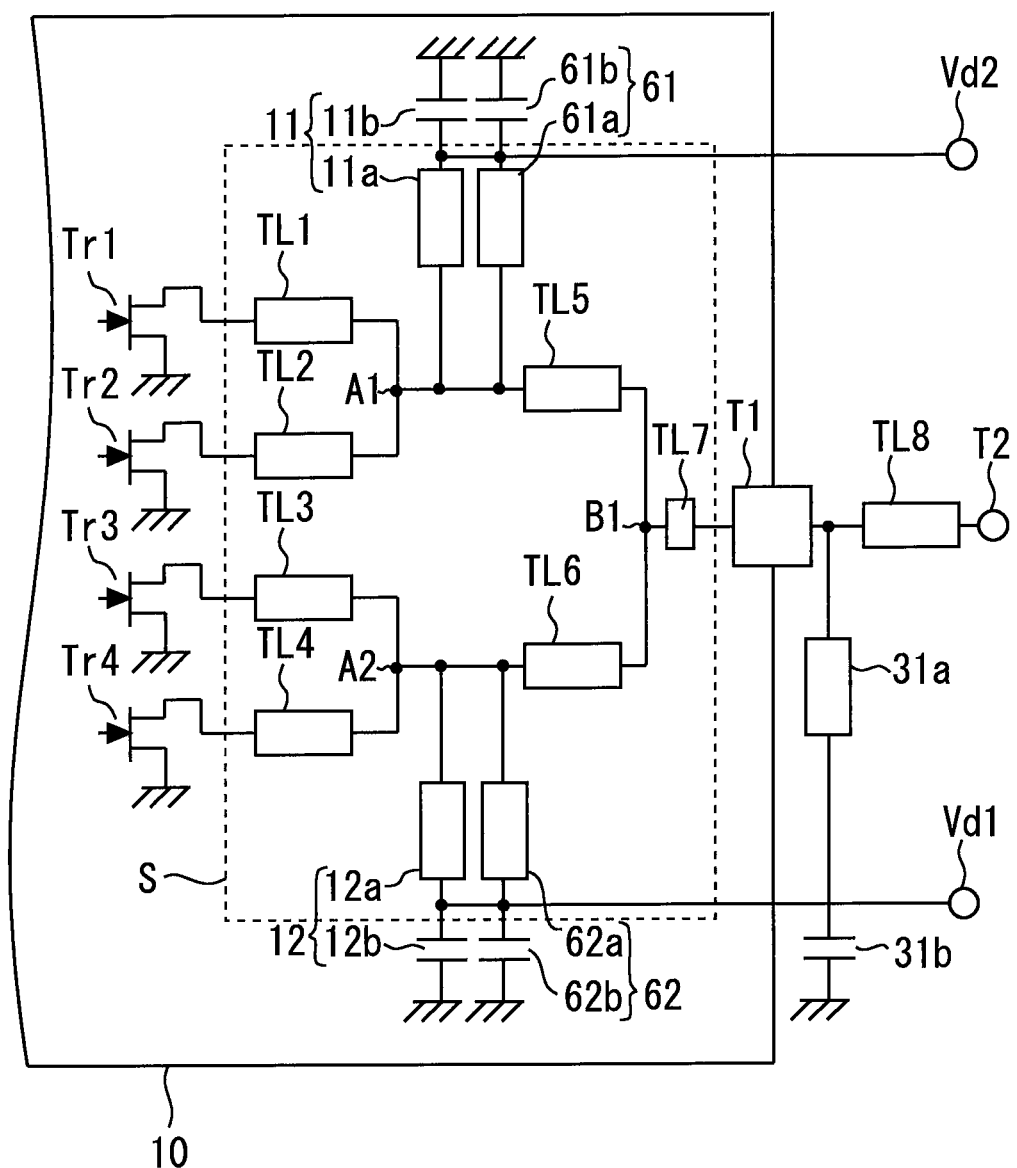
FIG. 14 is a circuit diagram illustrating a power amplifier circuit according to another modification example.

FIG. 14 is a circuit diagram illustrating a power amplifier circuit according to another modification example. The power amplifier circuit of FIG. 14 is obtained by adding drain bias application terminals Vd1 and Vd2 to the power amplifier circuit of FIG. 13 and removing the terminal T3 is removed. The drain bias application terminal Vd2 is a terminal for applying a drain bias to at least two amplifiers among the plural amplifiers via the inductor 61a of the supplementary difference frequency short circuit 61 and the inductor 11a of the difference frequency short circuit 11 connected with the same node as the supplementary difference frequency short circuit 61. The drain bias application terminal Vd1 is a terminal for applying a drain bias to at least two amplifiers among the plural amplifiers via the inductor 62a of the supplementary difference frequency short circuit 62 and the inductor 12a of the difference frequency short circuit 12 connected with the same node as the supplementary difference frequency short circuit 62.

As described above, the λ/4 lines in the package can be utilized as application paths of a drain bias. Because a current can be caused to flow through a parallel circuit having the inductor 61a and the inductor 11a by the drain bias application terminal Vd2, an allowable amount of a drain current can be made large. Because a current can be caused to flow through a parallel circuit having the inductor 62a and the inductor 12a by the drain bias application terminal Vd1, the allowable amount of the drain current can be made large.

For example, even in a configuration having no supplementary difference frequency short circuit illustrated in FIG. 12, a drain bias application terminal connected with an inductor of the difference frequency short circuit may be provided. In this case, a drain bias can be applied from the drain bias application terminal to at least two amplifiers among the plural amplifiers via the inductor of the difference frequency short circuit.

Figure 15:
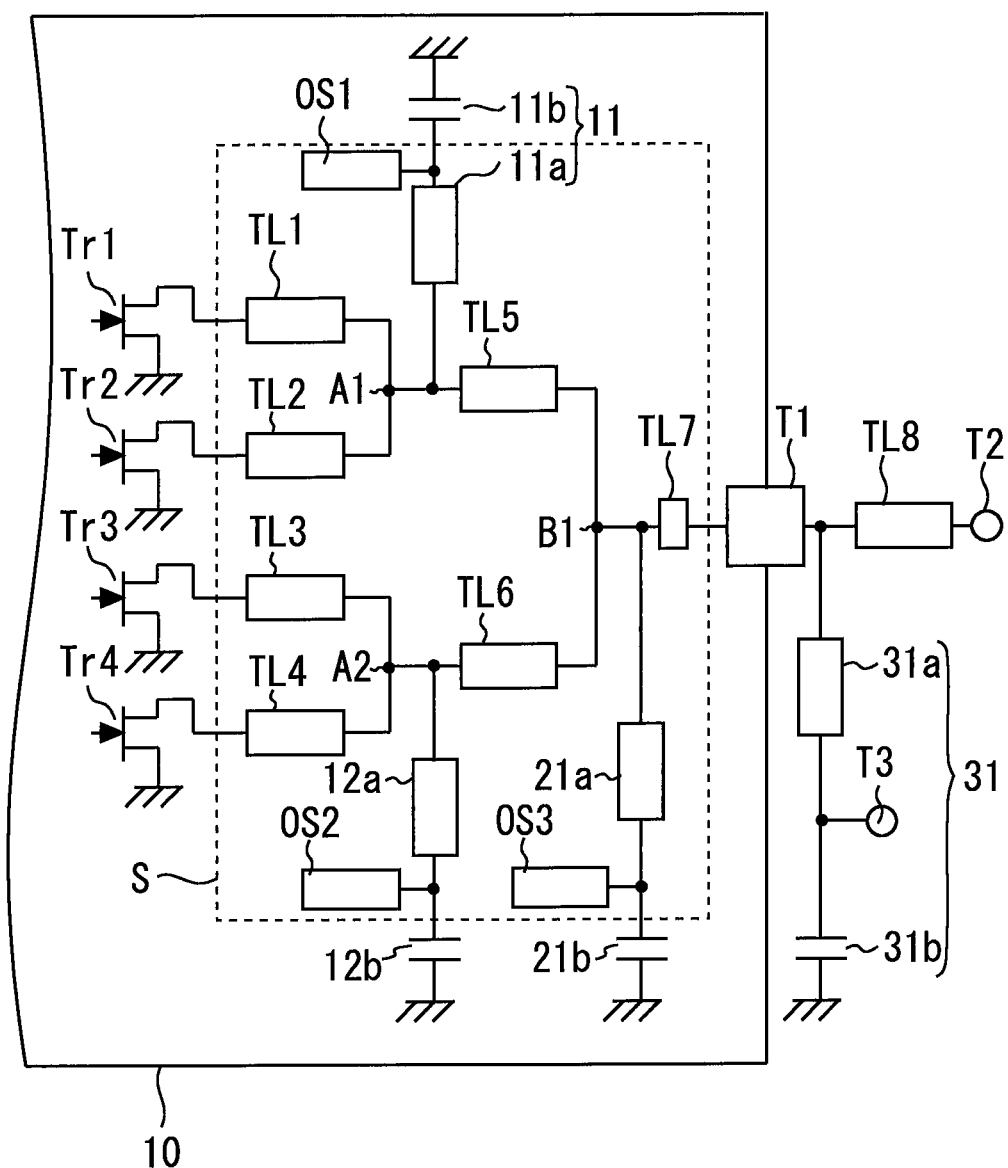
FIG. 15 is a circuit diagram illustrating a power amplifier circuit according to another modification example.

FIG. 15 is a circuit diagram illustrating a power amplifier circuit according to another modification example. The power amplifier circuit of FIG. 15 is a power amplifier circuit of FIG. 1 to which open stubs OS1, OS2, and OS3 are added. The open stub OS1 is a λ/4 line whose one end is connected between the inductor 11a and the capacitor 11b. The open stub OS2 is a λ/4 line whose one end is connected between the inductor 12a and the capacitor 12b. The open stub OS3 is a λ/4 line whose one end is connected between the inductor 21a and the capacitor 21b. A λ/4 line denotes a ¼ wavelength line at a fundamental wave frequency of an operation frequency of a power amplifier.

Because the open stubs OS1, OS2, and OS3 are arranged and ideal short-circuit points are thereby formed at joints of the open stubs at the operation frequency of the amplifier, difference frequency processing circuits with which the open stubs are connected can be caused to appear to be more open. Accordingly, an influence on impedance mismatch at the operation frequency due to connection of the difference frequency processing circuits can be reduced, and degradation of basic characteristics can be suppressed.

With respect to all of the power amplifiers described as examples in the above, how many difference frequency short circuits are connected with one node and on which of the inside or outside of the package the difference frequency short circuit is arranged may be determined in consideration of restriction of a component mounting area. In the above-described examples, at least one inductor and at least one transmission line are formed on the substrate S as a microwave integrated circuit substrate; however, a whole circuit including an inductor, a transmission line, and a transistor may be composed of an MMIC.

Further, in the above embodiment, all of the inductors constituting the difference frequency short circuits are the λ/4 lines having the inductance L1; however, those do not necessarily have to be λ/4 lines, and not all difference frequency short circuits have to have the same inductance. Characteristics of an inductor and a capacitor may be set such that the product of a capacitance and an inductance of the difference frequency short circuit becomes a desired value. The above-described power amplifiers may be provided as high-frequency power amplifiers which amplify a high-frequency signal such as a microwave and a millimeter wave.

The modifications mentioned in the first embodiment can be applied to a power amplifier according to the following embodiment.

Second Embodiment

Figure 16:
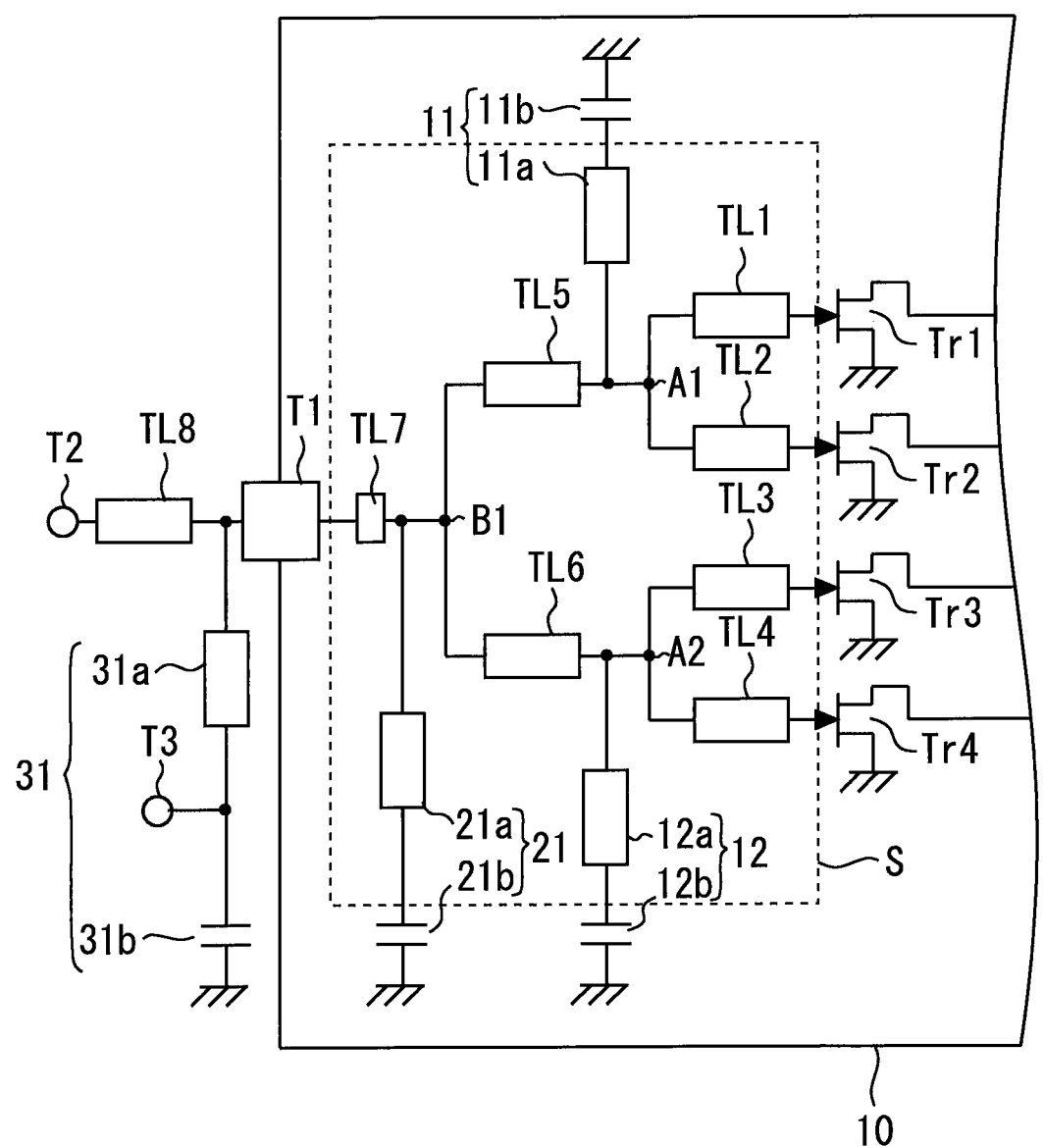
FIG. 16 is a circuit diagram illustrating a power amplifier according to a second embodiment.

FIG. 16 is a circuit diagram illustrating a power amplifier according to a second embodiment. In this power amplifier, technical features described in the first embodiment are applied to gate sides of transistors Tr1, Tr2, Tr3, and Tr4. The power amplifier of the second embodiment can be obtained by inverting inputs and outputs in the configuration described in the first embodiment with respect to the transistors. A tournament-tree-shaped circuit in the second embodiment is a tournament-tree-shaped distributor circuit which has transmission lines TL1, TL2, TL3, TL4, TL5, TL6, TL7, and TL8 and distributes an input signal to plural amplifiers. Note that the tournament-tree-shaped combiner circuit described in the first embodiment may be connected with output sides of the transistors Tr1, Tr2, Tr3, and Tr4. A terminal T2 in the second embodiment functions as an input terminal, and a terminal T3 functions as a gate voltage application terminal for the transistors. Various technical features described in the first embodiment can be realized in a circuit on the input sides of the transistors.

In a configuration of the second embodiment, the difference frequency short circuits described in the first embodiment are provided on the input sides of the transistors, and impedances of an input circuit as seen from transistor connection sides from Δf1 to Δf3 can equivalently be reduced with respect to all of the transistors. Thus, a distortion voltage component occurring at the detuning frequency can continuously be suppressed in a frequency band from Δf1 to Δf3. Accordingly, even in a case where the detuning frequency is expanded, degradation of the distortion characteristics can be prevented from the minimum detuning frequency to the maximum detuning frequency.

Figure 17:
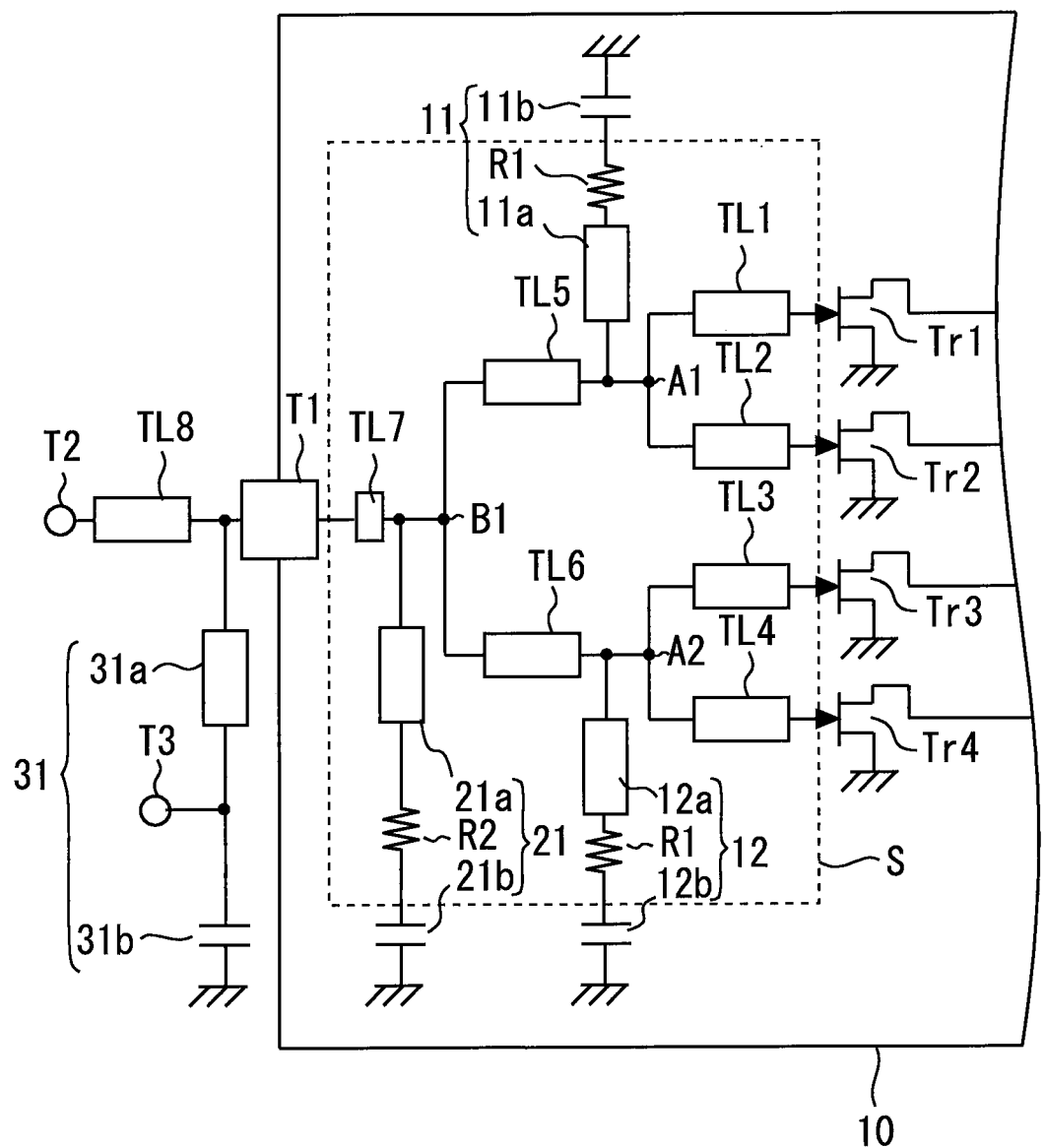
FIG. 17 is a circuit diagram illustrating a power amplifier according to a modification example.

FIG. 17 is a circuit diagram illustrating a power amplifier according to a modification example. This power amplifier includes a resistor connected in series with an inductor or a capacitor in the difference frequency short circuit. Specifically, a difference frequency short circuit 11 has a resistor R1, a difference frequency short circuit 12 has the resistor R1, and a difference frequency short circuit 21 has a resistor R2. The resistor R1 of the difference frequency short circuit 11 is connected between an inductor 11a and a capacitor 11b but may be provided in another position as long as the resistor R1 is connected in series with the inductor 11a or the capacitor 11b. The resistor R1 of the difference frequency short circuit 12 is connected between an inductor 12a and a capacitor 12b but may be provided in another position as long as the resistor R1 is connected in series with the inductor 12a or the capacitor 12b. The resistor R2 of the difference frequency short circuit 21 is connected between an inductor 21a and a capacitor 21b but may be provided in another position as long as the resistor R2 is connected in series with the inductor 21a or the capacitor 21b. Undesired oscillation can be suppressed by the resistors R1 and R2.

The features of the first and second embodiments described above can be combined.

REFERENCE SIGNS LIST

Tr1, Tr2, Tr3, Tr4 transistor; TL1, TL2, TL3, TL4, TL5, TL6, TL7, TL8 transmission line; 11, 12, 21, 31 difference frequency short circuit

The invention claimed is:

1. A power amplifier comprising:
  plural amplifiers;
  a tournament-tree-shaped circuit connected with the plural amplifiers and including plural transmission lines arranged in a tournament-tree shape; and
  plural difference frequency short circuits shunt-connected with plural nodes of the tournament-tree-shaped circuit,
  wherein each of the plural difference frequency short circuits includes an inductor and a capacitor connected in series,
  resonant frequencies of the plural difference frequency short circuits decrease as the plural difference frequency short circuits are more distanced from the plural amplifiers, and
  the difference frequency short circuits having equivalent resonant frequencies are connected with plural nodes in a same stage among the plural nodes.

2. The power amplifier according to claim 1, comprising a package on which the plural amplifiers are mounted,
  wherein the difference frequency short circuit having a resonant frequency which is equivalent to or higher than a predetermined specific resonant frequency is provided in the package, and
  the difference frequency short circuit having a resonant frequency which is lower than the specific resonant frequency is provided outside the package.

3. The power amplifier according to claim 2, wherein the specific resonant frequency is 10 MHz.

4. The power amplifier according to claim 1, wherein the inductor is a ¼ wavelength line at a fundamental wave frequency of an operation frequency of the power amplifier.

5. The power amplifier according to claim 4, comprising a microwave integrated circuit substrate on which at least one inductor and at least one transmission line are formed.

6. The power amplifier according to claim 2, wherein the plural amplifiers include four amplifiers,
  two of the difference frequency short circuits is flare provided in the package, and
  one of the difference frequency short circuits is provided outside the package.

7. The power amplifier according to claim 1, comprising a supplementary difference frequency short circuit which is a series LC circuit shunt-connected with the node with which the difference frequency short circuit is shunt-connected,
  wherein a resonant frequency of the supplementary difference frequency short circuit is higher than a resonant frequency of the difference frequency short circuit which is more distanced from the plural amplifiers than the supplementary difference frequency short circuit.

8. The power amplifier according to claim 7, comprising a drain bias application terminal for applying a drain bias to at least two amplifiers among the plural amplifiers via an inductor of the supplementary difference frequency short circuit and an inductor of the difference frequency short circuit connected with a same node as the supplementary difference frequency short circuit.

9. The power amplifier according to claim 1, comprising a drain bias application terminal for applying a drain bias to at least two amplifiers among the plural amplifiers via the inductors of the difference frequency short circuits.

10. The power amplifier according to claim 1, comprising an open stub which is a ¼ wavelength line at a fundamental wave frequency of an operation frequency of the power amplifier and connected between the inductor and the capacitor.

11. The power amplifier according to claim 1, wherein the tournament-tree-shaped circuit is a tournament-tree-shaped combiner circuit which combines amplification signals of the plural amplifiers.

12. The power amplifier according to claim 1, wherein the tournament-tree-shaped circuit is a tournament-tree-shaped distributor circuit which distributes an input signal to the plural amplifiers.

13. The power amplifier according to claim 12, wherein each of the difference frequency short circuits includes a resistor connected in series with the inductor or the capacitor.

14. The power amplifier according to claim 1, wherein the resonant frequencies of the plural difference frequency short circuits are present between a minimum value and a maximum value which are given as a differential frequency or a difference frequency between a high frequency edge and a low frequency edge of a high-frequency signal to be amplified by the plural amplifiers.

\* \* \* \* \*